(12) United States Patent  
Song et al.

(10) Patent No.: US 12,464,848 B2
(45) Date of Patent: Nov. 4, 2025

(54) SOLAR CELL DEVICE AND METHOD FOR PRODUCING THE SAME

(71) Applicant: TIANJIN SANAN OPTOELECTRONICS CO., LTD., Tianjin (CN)

(72) Inventors: Minghui Song, Tianjin (CN); Lingling Tao, Tianjin (CN); Xuemin Sun, Tianjin (CN); Tian Chen, Tianjin (CN); Chengtai Wei, Tianjin (CN); Xiufeng Xin, Tianjin (CN); Wenjun Chen, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 0 days.

(21) Appl. No.: 18/057,131

(22) Filed: Nov. 18, 2022

(65) Prior Publication Data

US 2023/0215963 A1 Jul. 6, 2023

(30) Foreign Application Priority Data

Dec. 30, 2021 (CN) .......................... 202111651868.4

(51) Int. Cl.
*H10F 77/14* (2025.01)
*H10F 10/161* (2025.01)
*H10F 77/20* (2025.01)
*H10F 10/163* (2025.01)

(52) U.S. Cl.
CPC ......... *H10F 77/147* (2025.01); *H10F 10/161* (2025.01); *H10F 77/211* (2025.01); *H10F 10/163* (2025.01)

(58) Field of Classification Search
CPC ..... H01L 31/022425; H01L 31/035281; H01L 31/0725; H01L 31/0735; H01L 31/04; H01L 31/042; H01L 31/0445
See application file for complete search history.

(56) References Cited

U.S. PATENT DOCUMENTS

| | | | |
|---|---|---|---|
| 8,569,097 B1* | 10/2013 | Bedell | H01L 21/02381 438/460 |
| 2009/0078310 A1* | 3/2009 | Stan | H01L 31/06875 136/262 |
| 2010/0047959 A1* | 2/2010 | Cornfeld | H01L 31/0735 438/455 |
| 2015/0236182 A1* | 8/2015 | Moslehi | H01L 31/02245 136/249 |
| 2016/0380143 A1* | 12/2016 | Hekmatshoartabari | H01L 31/02327 438/74 |
| 2022/0375910 A1* | 11/2022 | Liao | H01L 31/1016 |

* cited by examiner

Primary Examiner — Mayla Gonzalez Ramos
(74) Attorney, Agent, or Firm — Muncy, Geissler, Olds & Lowe, P.C.

(57) ABSTRACT

A solar cell device includes a supporting substrate, and an epitaxial active structure that is disposed on the supporting substrate. The epitaxial active structure has a bottom surface adjacent to the supporting substrate and a top surface opposite to the bottom surface, and is formed with an isolation section that extends from the top surface to the bottom surface. A method for producing the solar cell device is also disclosed.

18 Claims, 7 Drawing Sheets

SOLAR CELL DEVICE AND METHOD FOR PRODUCING THE SAME

CROSS-REFERENCE TO RELATED APPLICATION

This application claims priority of Chinese Patent Application No. 202111651868.4, filed on Dec. 30, 2021.

FIELD

The present disclosure relates to a semiconductor optoelectronic device, and more particularly to a solar cell device and a method for producing the same.

BACKGROUND

In recent years, solar energy has been applied in several fields including home use, spacecraft, etc. Therefore, performance indicators of solar cells such as efficiency, planar density, reliability, and so forth are important. Making the solar cells lightweight and flexible so that they may be widely applied has become an inevitable trend.

A flexible solar cell is a type of thin-film solar cell and offers advantages such as, but not limited to, low cost, lightweight, and bendable. Due to the aforesaid advantages, demands for manufacturing flexible solar cells have grown rapidly, and manufacturers are focusing on increasing production capacity and exploring more semiconductor materials in terms of diversity. A III-V compound semiconductor material (e.g. gallium arsenide), which has a bandgap that matches with the solar spectrum and is capable of resisting high temperature, has attracted much attention in the solar energy industry.

When manufacturing the flexible solar cell, normal bonding methods, such as gold ball wire bonding and ultrasonic bonding, may not be possible in a solder interconnecting process. Therefore, when manufacturing and packaging the flexible solar cell, a connecting strip having conductive adhesive becomes appropriate for the solder interconnecting process. However, in the conventional flexible solar cell, an epitaxial active layer has a side wall that is directly exposed to outside, which may cause the conductive adhesive to adhere on the side wall of the epitaxial active layer or cause the interconnecting strip to be in direct contact with the side wall of the epitaxial active layer. In such case, problems such as current leakage, short circuit, and so forth in the flexible solar cell are likely to occur, thereby adversely affecting the performance of the flexible solar cell.

SUMMARY

Therefore, an object of the disclosure is to provide a solar cell device, and a production method thereof that can alleviate at least one of the drawbacks of the prior art.

According to a first aspect of the disclosure, a solar cell device includes a supporting substrate, and an epitaxial active structure that is disposed on the supporting substrate. The epitaxial active structure has a bottom surface adjacent to the supporting substrate and a top surface opposite to the bottom surface, and is formed with an isolation section that extends from the top surface to the bottom surface. The epitaxial active structure is divided into a first active section and a second active section by the isolation section.

According to a second aspect of the disclosure, a method for producing a solar cell device includes the steps of: (a) providing a growth substrate; (b) forming a stopping layer on the growth substrate by metal organic chemical vapor deposition; (c) epitaxially growing an epitaxial active structure on the stopping layer, the epitaxial active structure including a contact layer contacting with the stopping layer; (d) connecting a surface of the epitaxial active structure that faces away from the stopping layer with a supporting substrate, so as to transfer the epitaxial active structure to the supporting substrate; (e) removing the growth substrate and the stopping layer to expose the contact layer of the epitaxial active structure; (f) patterning the epitaxial active structure to form an isolation section and at least one dicing line by an etching process, the isolation section extending from a top surface to a bottom surface of the epitaxial active structure such that the epitaxial active structure is divided into a first active section and a second active section by the isolation section; (g) coating a photoresist layer on the contact layer of the epitaxial active structure, and patterning the photoresist layer, such that a portion of the contact layer is exposed from the patterned photoresist layer; (h) depositing a metal material on the patterned photoresist layer and the portion of the contact layer, and removing the patterned photoresist layer such that a first portion of the metal material that is deposited on the patterned photoresist layer is removed, and such that a second portion of the metal material, which is formed on the portion of the contact layer, serves as an electrode pad; (i) removing another portion of the contact layer that is exposed from the electrode pad; (j) forming a reflection reducing layer on a surface of the epitaxial active structure that faces in a direction away from the supporting substrate, so as to obtain a solar cell laminate including the supporting substrate, the epitaxial active structure having the isolation section and the at least one dicing line, the reflection reducing layer, and the electrode pad; and (k) dicing the solar cell laminate along the dicing line that is formed on the epitaxial active structure to obtain the solar cell device.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
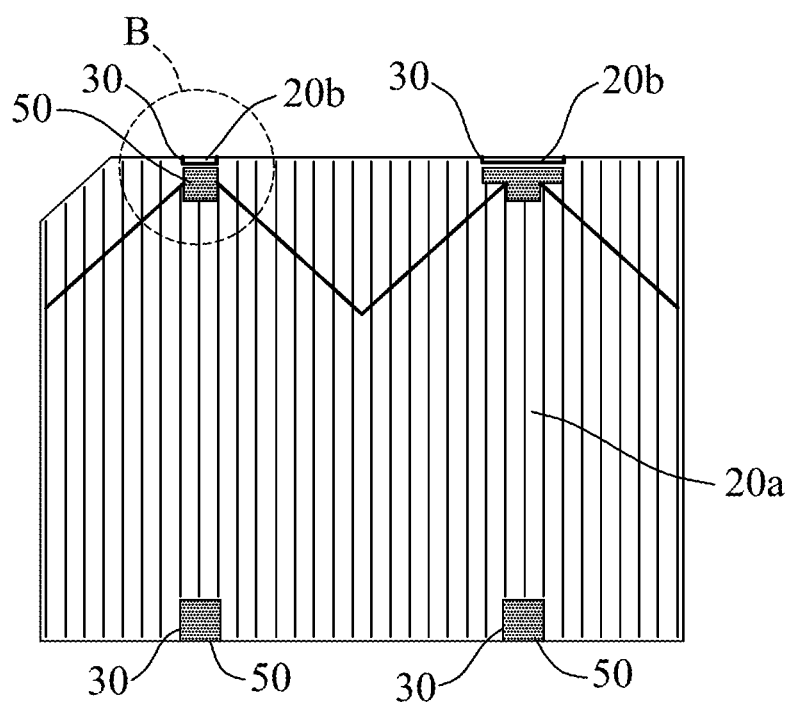
FIG. 1 is a schematic top view illustrating an embodiment of a solar cell device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
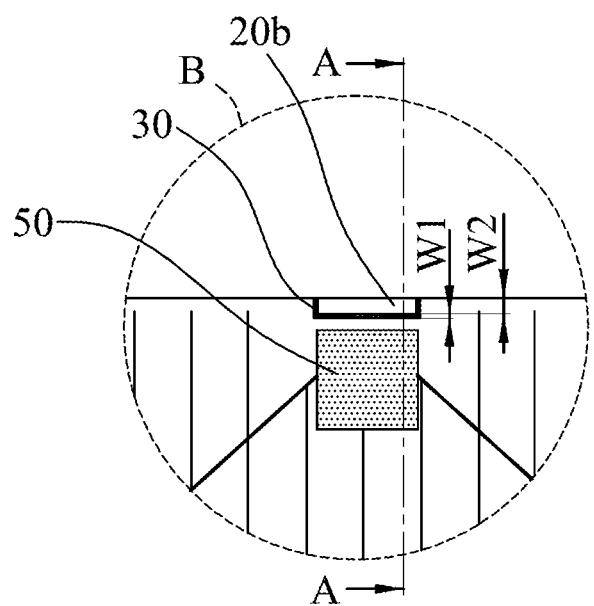
FIG. 2 is an enlarged view of a region B shown in FIG. 1.
Figure 3:
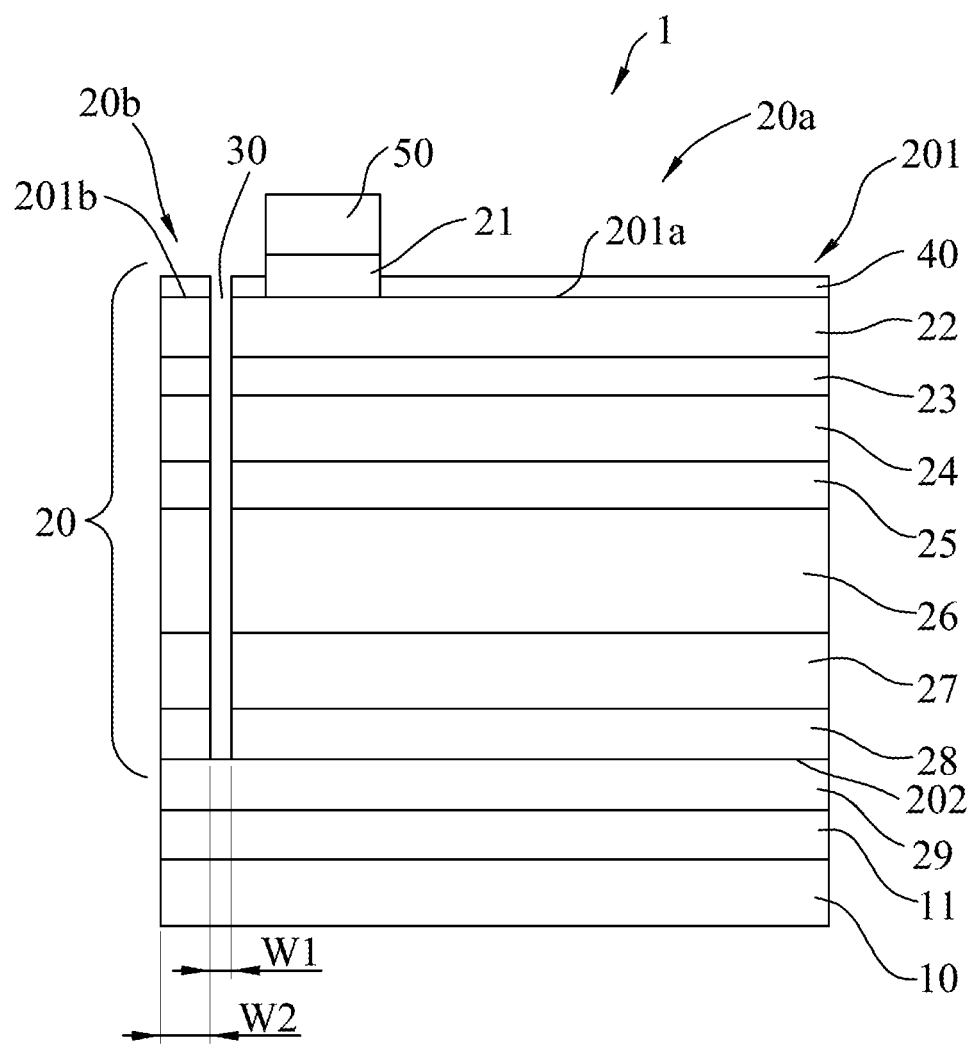
FIG. 3 is a sectional view taken along line A-A of FIG. 2.

FIGS. 1 to 3 illustrate a solar cell device 1 of an embodiment according to the present disclosure. FIG. 1 is a schematic top view illustrating the embodiment of the solar cell device 1, FIG. 2 is an enlarged view of a region B shown in FIG. 1, and FIG. 3 is a sectional view taken along line A-A of FIG. 2. It should be noted that, in this embodiment, the solar cell device 1 is formed as a flexible solar cell, but is not limited to.

Referring to FIGS. 1 to 3, the solar cell device 1 includes a supporting substrate 10, an epitaxial active structure 20 that is disposed on the supporting substrate 10, a reflection reducing layer 40, and an electrode pad 50. In some embodiments, the solar cell device 1 further includes a first bonding layer 11 and a second bonding layer 29 that are interposed between the supporting substrate 10 and the epitaxial active structure 20.

The supporting substrate 10 is formed as a flexible substrate or a rigid substrate. The flexible substrate is made from one of alloy material, semiconductor material, and polyimide (PI) material. In some embodiments, the flexible substrate is a Kovar substrate (i.e., iron-cobalt-nickel alloy substrate), and the rigid substrate is made from germanium.

In this embodiment, the supporting substrate 10 is a flexible substrate. In certain embodiments, the supporting substrate 10 is formed as a flexible transparent substrate that is made from colorless polyimide (CPI).

Referring to FIG. 3, the epitaxial active structure 20 has a bottom surface 202 adjacent to the supporting substrate 10 and a top surface 201 opposite to the bottom surface 202. The epitaxial active structure 20 is formed with an isolation section 30 that extends from the top surface 201 to the bottom surface 202. The epitaxial active structure 20 is divided into a first active section 20a and a second active section 20b by the isolation section 30.

In different modified embodiments, the epitaxial active structure 20 may be a single junction structure or a multi-junction structure. In the epitaxial active structure 20, the first active section 20a and the second active section 20b are formed as the same type of the junction structure. The top surface 201 of the epitaxial active structure 20 has a first surface region 201a on the first active section 20a and a second surface region 201b on the second active section 20b, and a difference in height between the first and second surface regions 201a, 201b is less than 1 µm. By keeping the difference in height less than 1 µm, when the epitaxial active structure 20 is in an unfolded state, the first active section 20a and the second active section 20b may be ensured to be on the same plane, which may facilitate subsequent processing of the epitaxial active structure 20.

A configuration of the epitaxial active structure 20 that is the multi-junction structure is described below. Referring to FIG. 3, the epitaxial active structure 20 includes a contact layer 21, a first battery 22, a first tunneling junction 23, a second battery 24, a second tunneling junction 25, a buffer layer 26, a third battery 27, and a capping layer 28 in such order from the top surface 201 of the epitaxial active structure 20.

Referring to FIG. 3, the contact layer 21 is partially disposed on the first battery 22 opposite to the first tunneling junction 23, and is located at first active section 20a. It should be noted that, in this embodiment, the contact layer 21 is made from gallium arsenide (GaAs), the first battery 22 is made from gallium indium phosphide (GaInP), the second battery 24 is made from gallium arsenide (GaAs), and the third battery 27 and the capping layer 28 are made from Indium gallium arsenide (InGaAs).

The first tunneling junction 23 is formed to connect the first battery 22 and the second battery 24, and the second tunneling junction 25 is formed to connect the second battery 24 and the third battery 27. Furthermore, each of the first tunneling junction 23 and the second tunneling junction 25 is formed to produce a tunneling effect so as to permit passage of majority charge carriers and block passage of minority charge carriers. In some embodiments, each of the first and second tunneling junction 23, 25 is made from a doped material such as gallium arsenide and indium gallium phosphide, etc., or other suitable materials for producing the tunneling effect.

It should be noted that, the epitaxial active structure 20 and the supporting substrate 10 are connected by at least one of an adhesive process and a bonding process. In certain embodiments, the epitaxial active structure 20 and the supporting substrate 10 are connected by a glue (e.g. a pressure sensitive adhesive, PSA) or an adhesive agent (e.g. silica gel).

In this embodiment, the supporting substrate 10 and the epitaxial active structure 20 are bonded by a bonding metal layer. In such case, referring to FIG. 3, before bonding the supporting substrate 10 and the epitaxial active substrate 20 together, the first bonding layer 11 is disposed on the supporting substrate 10, and the second bonding layer 29 is disposed on the capping layer 28 of the epitaxial active structure 20. The first bonding layer 11 and the second bonding layer 29 are bonded to each other by metal-to-metal bonding such as gold-gold bonding and nickel-tin bonding so as to bond the supporting substrate 10 and the epitaxial active substrate 20 together.

In certain embodiments, each of the first and second bonding layers 11, 29 is made from titanium, platinum, gold, nickel, tin, or combinations thereof. The first bonding layer 11 and the second bonding layer 29 may be made from the same material or different materials. Furthermore, each of the first and second bonding layers 11, 29 may be formed as a single layer structure or a multi-layer structure. For instance, each of the first and second bonding layers 11, 29 may have a laminated structure containing a titanium layer, a platinum layer, and a gold layer that are arranged in such order. In such case, each of the titanium layer and the platinum layer has a thickness of 0.5 kA, and the gold layer has a thickness of 5 kA.

The reflection reducing layer 40 is disposed on a surface of the epitaxial active structure 20 that faces in a direction away from the supporting substrate 10. It should be noted that, when the epitaxial active structure 20 is the multi-junction structure, the reflection reducing layer 40 is partially disposed on a surface of the first battery 22 to surround a periphery of the contact layer 21. The reflection reducing layer 40 may be formed as a single layer structure, a double layer structure, or a multi-layer structure, and may be made from oxide, nitride, fluoride, etc. In certain embodiments, the reflection reducing layer 40 is made from an oxide such as titanium dioxide ($TiO_2$), aluminum oxide ($Al_2O_3$), etc. It should be noted that, when the reflection reducing layer 40 is formed as the double layer structure, the reflection reducing layer 40 may have a titanium dioxide layer and an aluminum oxide layer; when the reflection reducing layer 40 is formed as the multi-layer structure, the reflection reducing layer 40 may have a titanium dioxide layer, an aluminum oxide layer, and a magnesium fluoride layer. Moreover, in the reflection reducing layer 40, each of layers may have a reflectivity and a refractivity that are different from other layers.

Referring to FIGS. 1 to 3, the electrode pad 50 is disposed on the first active section 20a of the epitaxial active structure 20 opposite to the supporting substrate 10, and adjacent to the isolation section 30 of the epitaxial active structure 20. When the epitaxial active structure 20 is the multi-junction structure, the electrode pad 50 is disposed on the contact layer 21 opposite to the first battery 22, i.e., the electrode pad 50 is electrically connected to the first battery 22 though the contact layer 21. It should be noted that, an external device (not shown in the Figure) may be electrically connected to the electrode pad 50 of the solar cell device 1 through an interconnecting element. In some embodiments, the interconnecting element is connected to the electrode pad 50 by a conductive adhesive. In certain embodiments, the interconnecting element is an interconnecting strip. When a plurality of the solar cell devices 1 are interconnected by the interconnecting element, by forming the isolation section 30, the conductive adhesive is less likely to adhere on a side wall of the epitaxial active structure 20, and contact between the interconnecting element and the side wall of the epitaxial active structure 20 during a soldering process may be avoided, so that problems such as current leakage and/or short circuit are less likely to occur in the solar cell device 1.

Referring to FIG. 3, when the epitaxial active structure 20 is the multi-junction structure, the isolation section 30 is formed to penetrate the first battery 22, the first tunneling junction 23, the second battery 24, the second tunneling junction 25, the buffer layer 26, the third battery 27, and the capping layer 28, so as to divide the epitaxial active structure 20 into the first active section 20a and the second active section 20b. In this embodiment, the isolation section 30 is in the form of a recess, and the recess may be an empty recess, or be filled with a filler (e.g., an insulation material, silicon rubber, oxide that produces an inactivation effect on the epitaxial active structure 20, etc.). In some embodiments, the filler may further cover the first surface region 201a and the second surface region 201b of the top surface 201 of the epitaxial active structure 20.

In this embodiment, referring to FIGS. 2 and 3, a width (W1) of the isolation section 30 is not less than 100 μm, and is less than a width (W2) of the second active section 20b. By such configuration, sufficient spacing between the first active section 20a and the second active section 20b may be ensured, so that the aforesaid problems (i.e., current leakage and short circuit in the solar cell device 1) may be alleviated or avoided. It should be noted that, in certain embodiments, when the width (W1) is 100 μm, the width (W2) may be 200 μm or 300 μm.

It should be noted that, in this embodiment, referring to FIG. 3, the epitaxial active structure 20 is formed with a single isolation section 30 that is divided into the first active section 20a and the second active section 20b, but is not limited to. In other embodiments, the epitaxial active structure 20 may be formed with a plurality of the isolation sections 30, and the number of the second active section 20b corresponds to the number of the isolation sections 30.

Figure 4:
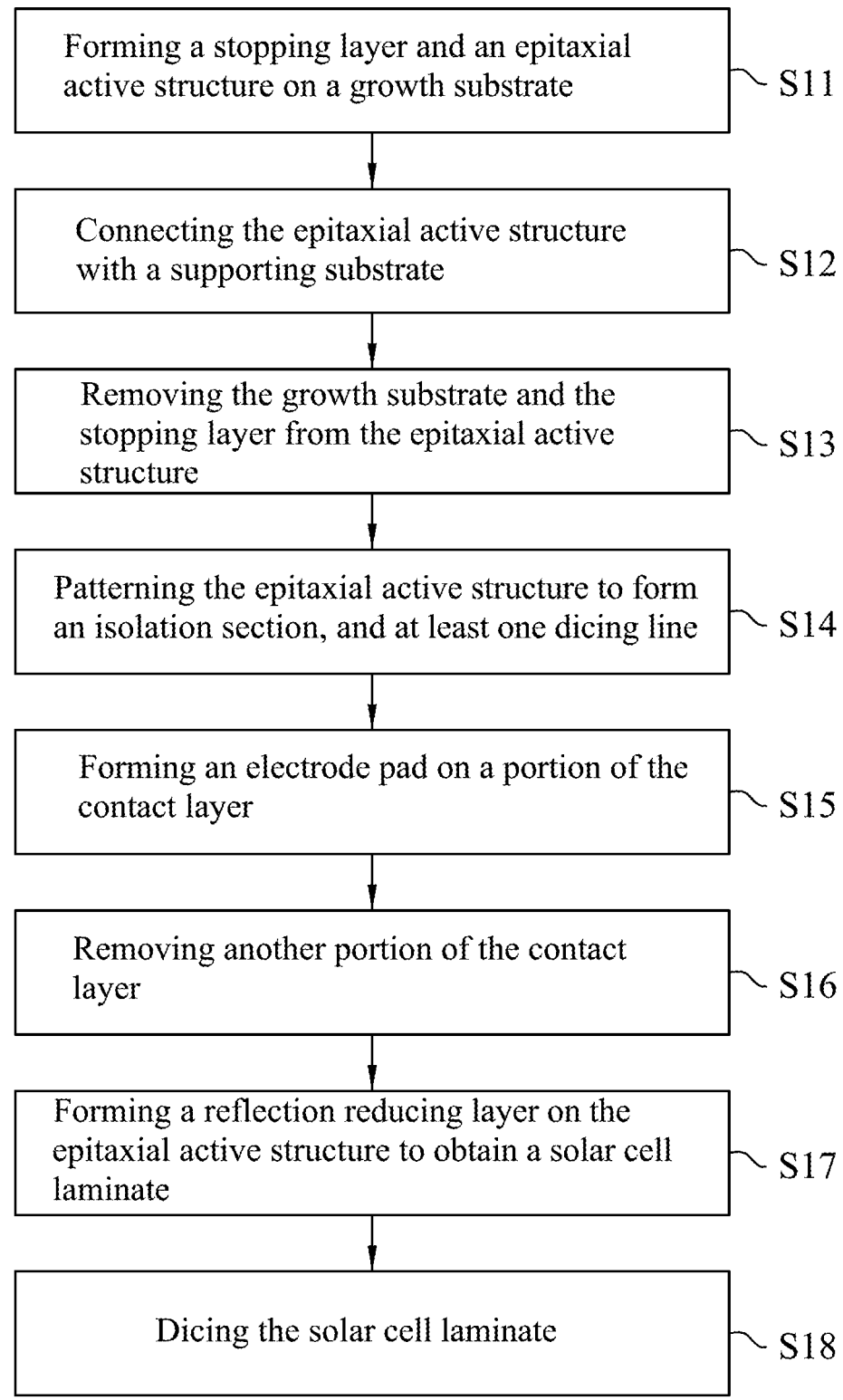
FIG. 4 is a flow chart illustrating consecutive steps of a method for producing the solar cell device of the embodiment.

FIGS. 4 to 11 illustrate a method for producing the solar cell device 1 of the present embodiment. FIG. 4 is a flow chart illustrating consecutive steps S11 to S18 of the method for producing the solar cell device 1 of the embodiment. FIGS. 5 to 11 are sectional views illustrating the steps of the method shown in FIG. 4.

Figure 5:
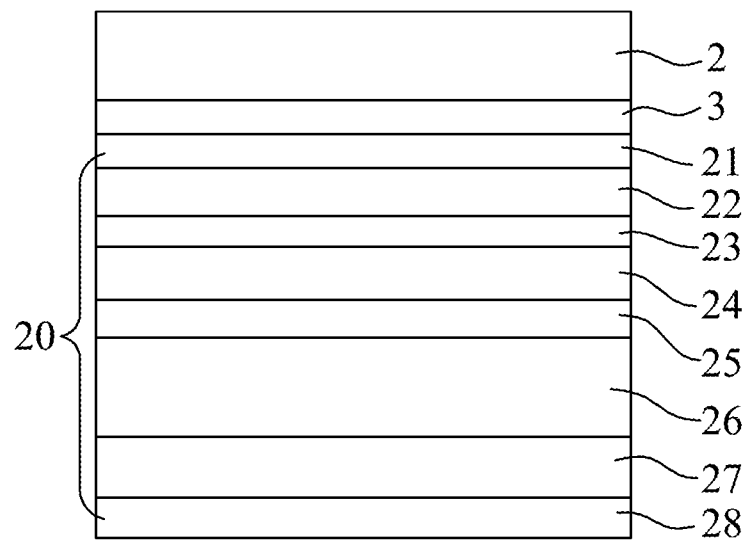
FIGS. 5 to 11 are sectional views illustrating the steps of the method shown in FIG. 4.

In step S11, referring to FIGS. 4 and 5, a stopping layer 3 and the epitaxial active structure 20 are formed on a growth substrate 2. In some embodiments, step S11 includes sub-steps of (i) providing the growth substrate 2, which may be a gallium arsenide substrate, (ii) forming the stopping layer 3 that may include a material (e.g. gallium indium phosphide) on the growth substrate 2 by metal organic chemical vapor deposition (MOCVD), (iii) epitaxially growing the epitaxial active structure 20 on the stopping layer 3.

In this embodiment, referring to FIG. 5, the epitaxial active structure 20 includes the contact layer 21, the first battery 22, the first tunneling junction 23, the second battery 24, the second tunneling junction 25, the buffer layer 26, the third battery 27, and the capping layer 28 in such order from the stopping layer 3. Furthermore, the contact layer 21 is in contact with the stopping layer 3.

Figure 6:
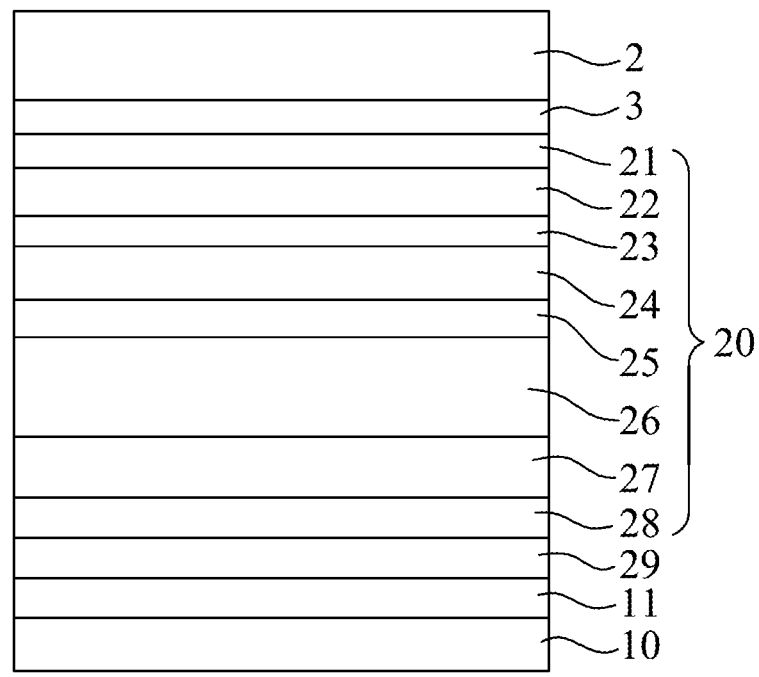

In step S12, referring to FIGS. 4 and 6, the epitaxial active structure 20 is connected to the support substrate 10. In some embodiments, a surface of the epitaxial active structure 20 that faces away from the stopping layer 3 (i.e. a surface at a side of the capping layer 28) is connected to the supporting substrate 10 by at least one of the adhesive process and the bonding process.

It should be noted that, referring to FIG. 6, before the epitaxial active structure 20 is connected to the support substrate 10, the second bonding layer 29 is formed on a surface of the capping layer 28 that faces away from the third battery 27 by vapor deposition, and the first bonding layer 11 is formed on the supporting substrate 10 by vapor deposition. Then, the first bonding layer 11 and the second bonding layer 29 are bonded together by metal-to-metal bonding such as gold-gold bonding and nickel-tin bonding, so as to transfer the epitaxial active structure 20 to the supporting substrate 10.

For instance, in a case where the epitaxial active structure 20 and the supporting substrate 10 are bonded by the gold-gold bonding process, the bonding process is performed at a temperature of 360° C., and under a pressure ranging from 6000 kgf to 12000 kgf for a time period of one hour. On the other hand, in a case where the epitaxial active structure 20 and the supporting substrate 10 are bonded by the nickel-tin bonding process, the bonding process is performed under a pressure ranging from 600 kgf to 1500 kgf.

Figure 7:
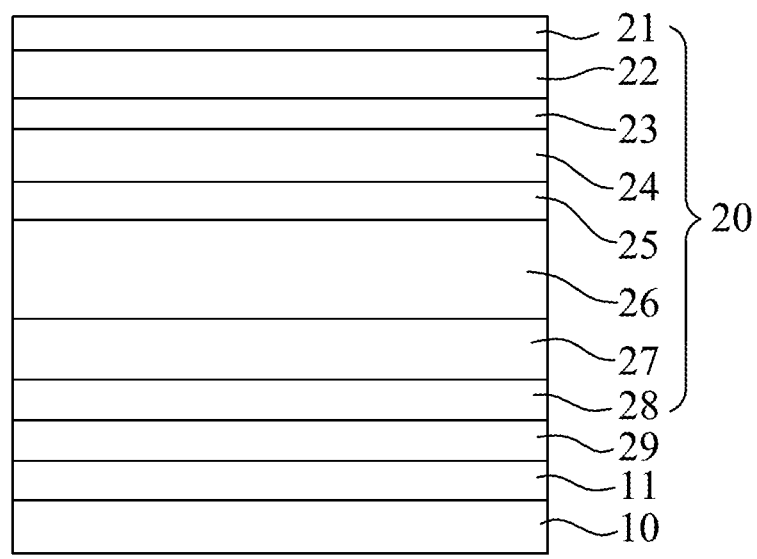

In step S13, referring to FIGS. 4 and 7, the growth substrate 2 and the stopping layer 3 are removed from the epitaxial active structure 20 to expose the contact layer 21. In some embodiments, before removing the growth substrate 2 and the stopping layer 3, a supporting glass plate (not shown in the Figure) is adhered to a side end of the supporting substrate 10 by an adhesive agent such as silica gel.

It should be noted that, in some embodiments, a solution, which includes $NH_4OH$, $H_2O_2$ and $H_2O$ in a volume ratio of 2:3:2, is used to remove the growth substrate 2, and a solution, which includes HCl and $H_3PO_4$ in a volume ratio of 1:1, is used to remove the stopping layer 3.

Figure 8:
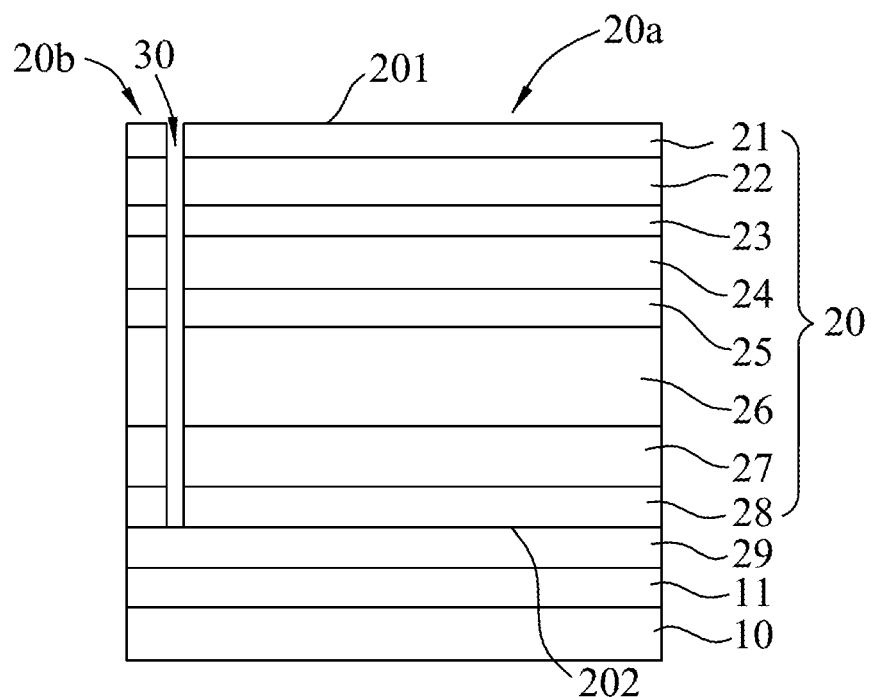

In step S14, referring to FIGS. 4 and 8, the epitaxial active structure 20 is patterned to form an isolation section 30, at least one dicing line (not shown in the Figure), and a bottom electrode (not shown in the Figure) using a photolithography process. In some embodiments, step S14 includes sub-steps of: (i) forming a photoresist on the top surface 201 of the epitaxial active structure 20, (ii) patterning the photoresist to partially expose the top surface 201 of the epitaxial active structure 20, (iii) patterning the epitaxial active structure 20 through the patterned photoresist by an etching process. The isolation section 30 extends from the top surface 201 to the bottom surface 202 of the epitaxial active structure 20 such that the epitaxial active structure 20 is divided into the first active section 20a and the second active section 20b by the isolation section 30.

It should be noted that, in some embodiments, an etchant, which includes HCl, HNO$_3$, CH$_3$COOH and H$_2$O in a volume ratio of 1:2:1:1, is used to etch the isolation section 30 and the dicing line.

In some embodiments, the etching process is selected from the group consisting of dry etching, wet etching, and a combination thereof. It should be noted that, referring to FIG. 8, in this step, the isolation section 30 is formed to penetrate the contact layer 21, the first battery 22, the first tunneling junction 23, the second battery 24, the second tunneling junction 25, the buffer layer 26, the third battery 27, and the capping layer 28 of the epitaxial active structure 20, so as to divide the epitaxial active structure 20 into the first active section 20a and the second active section 20b.

Figure 9:
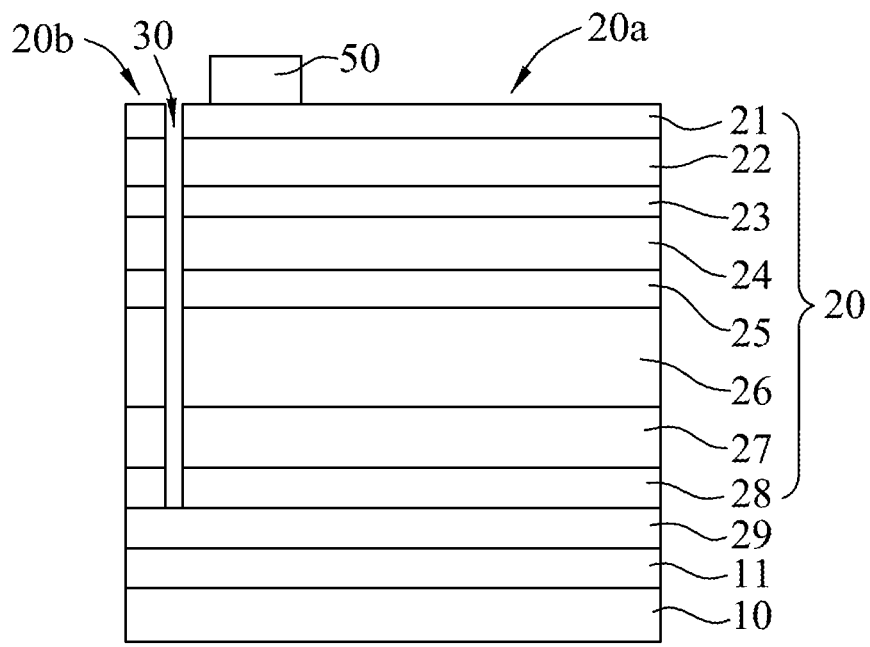

In step S15, referring to FIGS. 4 and 9, an electrode pad 50 is formed on a portion of the contact layer 21. In some embodiments, step S15 may be performed as follows. A photoresist layer (not shown in the Figure) is coated on the contact layer 21 of the epitaxial active structure 20. The photoresist layer is patterned, such that a portion of the contact layer 21 is exposed from the patterned photoresist layer.

Then, a metal material (e.g. gold-germanium-nickel alloy, gold, silver, or combinations thereof, etc.) is deposited on the patterned photoresist layer and the portion of the contact layer 21 by electron beam (E-beam) evaporator. The patterned photoresist layer is removed such that a first portion of the metal material, which is deposited on the patterned photoresist layer, is removed, and such that a second portion of the metal material, which is formed on the portion of the contact layer 21, serves as the electrode pad 50.

It should be noted that, the electrode pad 50 may be formed as a single layer structure or a multi-layer structure. For instance, the electrode pad 50 may have a laminated structure containing a gold-germanium-nickel alloy layer, a first gold layer, a silver layer, and a second gold layer that are arranged in such order. In such case, the gold-germanium-nickel alloy layer has a thickness of 0.7 kÅ, the first gold layer has a thickness of 0.1 kÅ, the silver layer has a thickness of 52 kÅ, and the second gold layer has a thickness of 0.1 kÅ.

Figure 10:
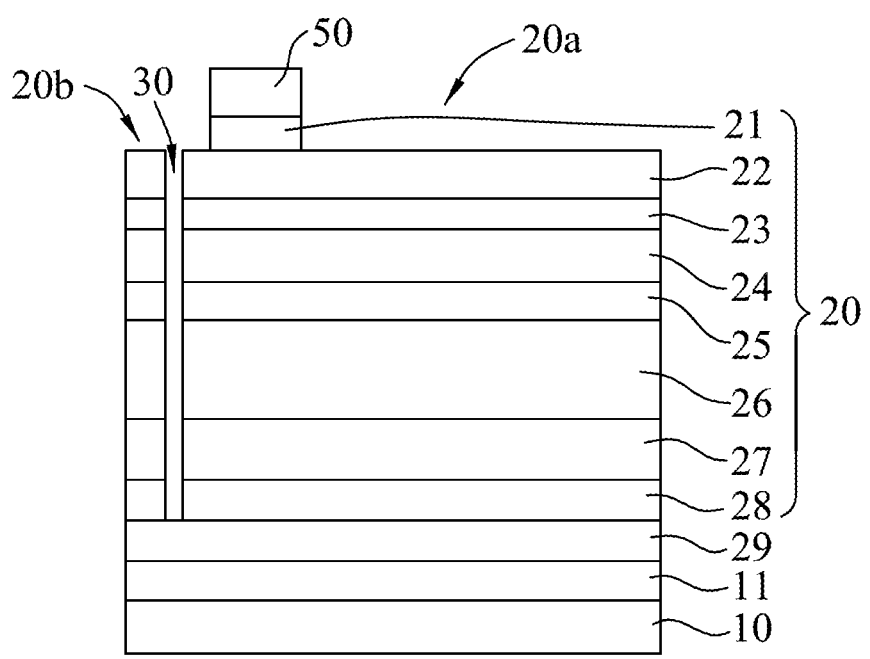

In step S16, referring to FIGS. 4 and 10, another portion of the contact layer 21 that is exposed from the electrode pad 50 is removed. It should be noted that, in this step, an acid solution, which may include C$_6$H$_8$O$_7$, H$_2$O and H$_2$O$_2$ in a volume ratio of 3:3:1, may be used to remove the another portion of the contact layer 21, and thus the remaining portion of the contact layer 21 is covered by the electrode pad 50.

In some embodiments, in this step, a solution, which includes HCl and H$_3$PO$_4$ in a volume ratio of 1:2, is used to passivate the side wall of the epitaxial active structure 20.

Figure 11:
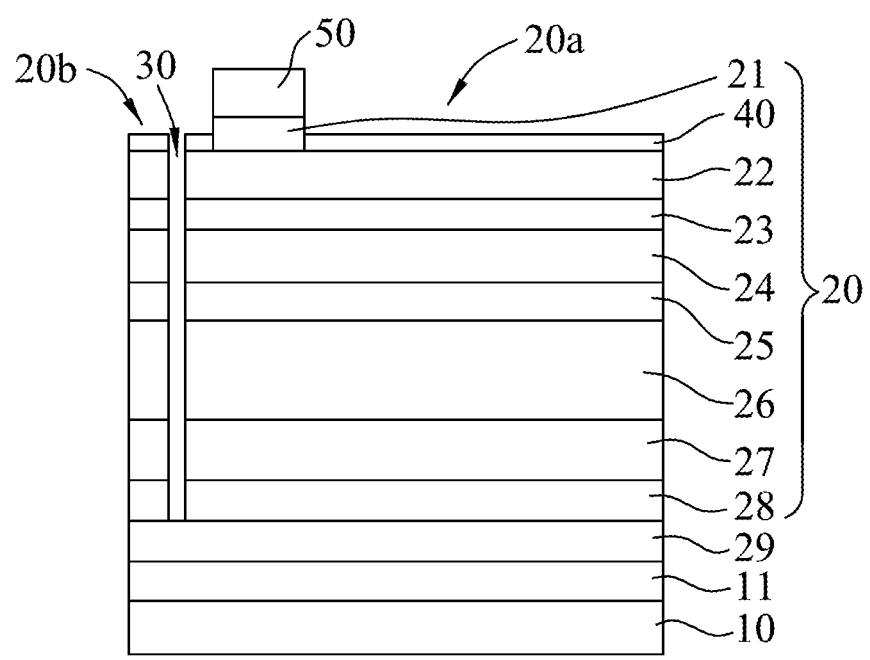

In step S17, referring to FIGS. 4 and 11, the reflection reducing layer 40 is formed on the epitaxial active structure 20 to obtain a solar cell laminate. In some embodiments, a material (e.g. titanium dioxide, aluminum oxide, magnesium fluoride, or combinations thereof, etc.) for forming the reflection reducing layer 40 is deposited on the epitaxial active structure 20 and the electrode pad 50 using vapor deposition, and is patterned using the photolithography process (e.g. anti-reflection overlay, etc.). The photolithography process includes (i) forming a patterned photoresist on the epitaxial active structure 20 to expose a portion of the material for forming the reflection reducing layer 40 that is deposited on the electrode pad 50, and (ii) removing the portion of the material using an etchant, which may include HF and H$_2$O in a ratio of 1:4, so as to form the reflection reducing layer 40 on the surface of the epitaxial active structure 20 that faces in a direction away from the supporting substrate 10. Thus, the solar cell laminate including the supporting substrate 10, the epitaxial active structure 20 having the isolation section 30 and the at least one dicing line, the reflection reducing layer 40, and the electrode pad 50 is obtained.

In some embodiments, the reflection reducing layer 40 is made from titanium dioxide (TiO$_2$), aluminum oxide (Al$_2$O$_3$), a magnesium fluoride (MgF$_2$), or combinations thereof. In this embodiment, the reflection reducing layer 40 has a thickness ranging from 38 nm to 70 nm. For instance, the reflection reducing layer 40 may have a laminated structure containing a titanium dioxide (TiO$_2$) layer, an aluminum oxide (Al$_2$O$_3$) layer, and a magnesium fluoride (MgF$_2$) layer that are arranged in such order from the first battery 22 of the epitaxial active structure 20. Furthermore, the reflection reducing layer 40 may also serve as the filler that fills the isolation section 30 of the epitaxial active structure 20.

In step S18, referring to FIG. 4, the solar cell laminate is diced along the dicing line that is formed on the epitaxial active structure 20 to obtain the solar cell device 1.

In this step, first, the supporting glass plate is removed. Second, the solar cell laminate is cleaned and annealed. Third, the solar cell laminate is diced along the dicing line. Then, the side wall of the epitaxial active structure 20 is passivated, so as to obtain the solar cell device 1. It should be noted that, the aforesaid passivation for the side wall of the epitaxial active structure 20 may be omitted according to the result of the dicing process. In some other embodiments, the step S18 is performed to obtain a plurality of the solar cell devices 1. The solar cell devices 1 may be used to produce other apparatus. It should be noted that, after the solar cell laminate be cleaned, the solar cell laminate is subjected to a rapid thermal annealing process in a furnace having a temperature of 320° C. for one minute.

In some embodiments, for the solar cell laminate formed with the bottom electrode (not shown in the Figure) on its back surface, after the solar cell laminate is cleaned and annealed, a metal layer is then formed on the supporting substrate 10 opposite to the epitaxial active structure 20 by vapor deposition. The metal layer may be formed as a single layer structure or a multi-layer structure. In certain embodiments, the metal layer is made from titanium, silver, gold, or combinations thereof. In some embodiments, the metal layer may have a laminated structure containing a titanium layer, a silver layer and a gold layer. In such case, the titanium layer has a thickness of 0.5 kÅ, the silver layer has a thickness of 30 kÅ, and the gold layer has a thickness of 0.05 kÅ.

In sum, by having the isolation section 30 in the epitaxial active structure 20, when the plurality of the solar cell devices 1 are interconnected, the conductive adhesive (e.g. silver conductive paste) is less likely to adhere on the side wall of the epitaxial active structure 20 of each of the solar cell devices 1, and contact between the interconnecting element and the side wall of the epitaxial active structure 20 of the solar cell devices 1 may be avoided during the soldering process or a packaging process, so that problems such as current leakage and short circuit are less likely to occur. Thus, the reliability of the solar cell devices 1 is enhanced.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A solar cell device, comprising:
   a supporting substrate;
   an epitaxial active structure disposed on said supporting substrate;
   grid lines;
   busbars extending across said grid lines; and
   an electrode pad having a block shape, said electrode pad being connected to said busbars and adapted to connect said busbars to an external device,
   wherein said epitaxial active structure has a bottom surface adjacent to said supporting substrate, a top surface opposite to said bottom surface and a periphery connected between said bottom surface and said top surface, and is formed with an isolation section extending from said top surface to said bottom surface,
   wherein said epitaxial active structure is divided into a first active section and a second active section by said isolation section,
   wherein said electrode pad is disposed on said first active section of said epitaxial active structure opposite to said supporting substrate, and is adjacent to said isolation section of said epitaxial active structure,
   wherein said second active section is separated from and located adjacent to said electrode pad, is closer to a portion of said periphery relative to said electrode pad, and has a block shape when viewed in a direction from said top surface to said bottom surface of said epitaxial active structure,
   wherein said isolation section extends between said electrode pad and said portion of said periphery of said epitaxial structure and extends further in a lateral direction to terminate at said portion of said periphery so that said portion of said periphery is isolated from a remaining portion of said periphery and so that said second active action is bounded by said isolation section and said portion of said periphery, a width of said second active action in an extension direction of said grid lines being smaller than a width of said electrode pad in said extension direction, a length of said second active action in a transverse direction transverse to said extension direction being not larger than a length of said electrode pad in said transverse direction, and
   wherein no block-shaped electrode pad is formed on said second active section.

2. The solar cell device as claimed in claim 1, wherein said epitaxial active structure is a single junction structure.

3. The solar cell device as claimed in claim 1, wherein said epitaxial active structure is a multi-junction structure.

4. The solar cell device as claimed in claim 1, wherein said supporting substrate is a flexible substrate.

5. The solar cell device as claimed in claim 1, wherein said top surface of said epitaxial active structure has a first surface region on said first active section and a second surface region on said second active section, a difference in height between said first and second surface regions being less than 1 μm.

6. The solar cell device as claimed in claim 1, wherein a width of said isolation section is not less than 100 μm, and is less than a width of said second active section.

7. The solar cell device as claimed in claim 1, wherein said isolation section is in the form of a recess.

8. A method for producing a solar cell device, comprising the steps of:
   (a) providing a growth substrate;
   (b) forming a stopping layer on the growth substrate by metal organic chemical vapor deposition;
   (c) epitaxially growing an epitaxial active structure on the stopping layer, and the epitaxial active structure including a contact layer contacting with the stopping layer;
   (d) connecting a surface of the epitaxial active structure that faces away from the stopping layer with a supporting substrate, so as to transfer the epitaxial active structure to the supporting substrate;
   (e) removing the growth substrate and the stopping layer to expose the contact layer of the epitaxial active structure;
   (f) patterning the epitaxial active structure to form an isolation section and at least one dicing line by an etching process, the isolation section extending from a top surface to a bottom surface of the epitaxial active structure such that the epitaxial active structure is divided into a first active section and a second active section by the isolation section;
   (g) coating a photoresist layer on the contact layer of the epitaxial active structure, and patterning the photoresist layer, such that a portion of the contact layer is exposed from the patterned photoresist layer;
   (h) depositing a metal material on the patterned photoresist layer and the portion of the contact layer, and removing the patterned photoresist layer such that a first portion of the metal material that is deposited on the patterned photoresist layer is removed, and such that a second portion of the metal material, which is formed on the portion of the contact layer, serves as an electrode pad;
   (i) removing another portion of the contact layer that is exposed from the electrode pad;
   (j) forming a reflection reducing layer on a surface of the epitaxial active structure that faces in a direction away from the supporting substrate, so as to obtain a solar cell laminate including the supporting substrate, the epitaxial active structure having the isolation section and the at least one dicing line formed in step (f), the reflection reducing layer, and the electrode pad; and (k) dicing the solar cell laminate along the dicing line that is formed on the epitaxial active structure to obtain the solar cell device, wherein the isolation section extends between the electrode pad and a portion of a periphery of the epitaxial active structure and extends further in a lateral direction to terminate at the portion of the periphery so that the portion of the periphery is divided and isolated from a remaining portion of the periphery and so that said second active action is bounded by said isolation section and said portion of said periphery, a width of said second active action in an extension direction of grid lines of the solar cell device being smaller than a width of said electrode pad in said extension direction, a length of said second active action in a transverse direction transverse to said extension direction being not larger than a length of said electrode pad in said transverse direction, wherein the second active section is separated from and located adjacent to said electrode pad, closer to the periphery of the epitaxial active structure relative to said electrode pad, and has a block shape when viewed in a direction from said top surface to said bottom surface of said epitaxial active structure; and wherein no block-shaped electrode pad is formed on said second active section.

9. The method as claimed in claim 8, wherein in the step (d), the epitaxial active structure and the supporting substrate are connected by at least one of an adhesive process and a bonding process.

10. The method as claimed in claim 8, wherein in the step (f), the etching process is selected from the group consisting of dry etching, wet etching, and a combination thereof.

11. The solar cell device as claimed in claim 1, wherein said second active section is partially surrounded by said isolation section.

12. The solar cell device as claimed in claim 11, wherein said isolation section is partially surrounded by said first active section.

13. The solar cell device as claimed in claim 1, wherein said isolation section is partially surrounded by said first active section.

14. The solar cell device as claimed in claim 1, wherein said second active section extends along only a part of said periphery of said solar cell device.

15. The method as claimed in claim 8, wherein said second active section is partially surrounded by said isolation section (30).

16. The method as claimed in claim 15, wherein said isolation section is partially surrounded by said first active section.

17. The method as claimed in claim 8, wherein said isolation section is partially surrounded by said first active section.

18. A solar cell device, comprising:
a supporting substrate;
an epitaxial active structure disposed on said supporting substrate;
grid lines;
busbars extending across said grid lines; and
an electrode pad connected to said busbars and adapted to connect said busbars to an external device;
wherein said epitaxial active structure has a bottom surface adjacent to said supporting substrate, a top surface opposite to said bottom surface and a periphery connected between said bottom surface and said top surface, and is formed with an isolation section extending from said top surface to said bottom surface,
wherein said epitaxial active structure is divided into a first active section and a second active section by said isolation section,
wherein said electrode pad is disposed on said first active section of said epitaxial active structure opposite to said supporting substrate, and is adjacent to said isolation section of said epitaxial active structure,
wherein said second active section is separated from and located adjacent to said electrode pad, is closer to a portion of said periphery relative to said electrode pad, and has no electrode pad, and
wherein said isolation section extends between said electrode pad and said portion of said periphery of said epitaxial structure and extends further in a lateral direction to terminate at said portion of said periphery so that said portion of said periphery is isolated from a remaining portion of said periphery and so that said second active action is bounded by said isolation section and said portion of said periphery, a width of said second active action in an extension direction of said grid lines being smaller than a width of said electrode pad in said extension direction, a length of said second active action in a transverse direction transverse to said extension direction being not larger than a length of said electrode pad in said transverse direction.

* * * * *